United States Patent

Huang et al.

[11] Patent Number: 6,118,731
[45] Date of Patent: Sep. 12, 2000

[54] METHOD OF ELIMINATING SIGNAL SKEW IN A SYNCHRONIZED DYNAMIC RANDOM-ACCESS MEMORY DEVICE

[75] Inventors: Shih-Huang Huang; Hsin-Pang Lu, both of Hsinchu, Taiwan

[73] Assignees: United Microelectronics Corp.; United Silicon Incorporated, both of Hsinchu, Taiwan

[21] Appl. No.: 09/389,817

[22] Filed: Sep. 3, 1999

[51] Int. Cl.$^7$ .................................... G11C 8/00
[52] U.S. Cl. ........................... 365/233; 365/149
[58] Field of Search .................. 365/233, 149, 365/150, 189.09, 191

[56] References Cited

U.S. PATENT DOCUMENTS

| | | | |
|---|---|---|---|
| 5,301,147 | 4/1994 | Guo et al. | 365/154 |
| 5,619,448 | 4/1997 | Lin | 365/185.03 |
| 5,917,220 | 6/1999 | Waggoner | 257/360 |

*Primary Examiner*—Amir Zarabian
*Assistant Examiner*—Anh Phung
*Attorney, Agent, or Firm*—Thomas, Kayden, Horstemeyer & Risley

[57] ABSTRACT

A method is proposed for eliminating signal skew in an SDRAM (Synchronized Dynamic Random-Access Memory) device resulting from the data signal being attenuated into different input signal amplitudes at the respective input points into the memory cells in the SDRAM device. The method is intended for use on a SDRAM device having at least a first memory cell and a second memory cell which are connected to a common signal line which transmits a data signal to both the first and the second memory cells. Due to the data signal being gradually attenuated along the signal line, the input signal amplitudes at the respective input points into the first and second memory cells are different, which would otherwise cause signal skew. In accordance with this method, the trigger voltage levels of the memory cells are adjusted in such a manner as to be substantially equal to the respective input signal amplitudes at a specific trigger time, so that all the memory cells can be triggered substantially concurrently without the occurrence of signal skew. Typically, the trigger voltage levels can be adjusted by adjusting the respective threshold voltages or current gains of the NMOS transistor and PMOS transistor in an inverter used as the I/O buffer of each memory cell. By this method, the adjustment can be easily achieved without having to provide additional circuitry to the SDRAM device. This method is therefore useful in solving the problem of signal skew in the SDRAM device.

12 Claims, 3 Drawing Sheets

METHOD OF ELIMINATING SIGNAL SKEW IN A SYNCHRONIZED DYNAMIC RANDOM-ACCESS MEMORY DEVICE

BACKGROUND OF THE INVENTION

1. Field of the Invention

This invention relates to SDRAM (Synchronized Dynamic Random-Access Memory) technology, and more particularly, to a method of eliminating signal skew in an SDRAM device resulting from the data signal being attenuated into different input signal amplitudes at the respective input points into the memory cells in the SDRAM device.

2. Description of Related Art

The performance of a computer system is dependent on CPU speed as well as memory access speed. Therefore, computer performance can be enhanced by using high-speed memory devices such as DRAM (Dynamic Random-Access Memory). Newer types of DRAMs, such as FPM (Fast Page Mode) DRAM, EDO (Extended Data Out) DRAM, and SDRAM (Synchronized DRAM), can provide very high access speed.

An SDRAM device is typically coupled with an I/O buffer between each memory cell and the signal line. As an SDRAM chip is increased in size to accommodate more transistor elements, it causes an increase in the signal transmission path, thus undesirably resulting in signal skew. This problem is illustratively depicted in the following with reference to FIG. 1.

FIG. 1 is a schematic diagram showing the circuit structure of a conventional SDRAM device. As shown, the SDRAM device includes a plurality of memory cells 11–16 that are connected to a common signal line 18. Each memory cell 11–16 includes an I/O buffer such as an inverter, respectively indicated by the reference numerals 21–26, whose input end is connected to the signal line 18 and whose output end is connected to the internal circuitry of each memory cell. FIG. 3 shows the circuit structure of each of these inverters 21–26, which includes an NMOS transistor 27 and a PMOS transistor 28 and has an input end IN and an output end OUT.

Referring back to FIG. 1, when a data signal S is being transmitted over the signal line 18, it is input into each of the memory cells 11–16 via the respective inverters 21–26. However, the data signal S enters directly into the first memory cell 11, subsequently via an RC circuit (i.e., the resistor R185 and the capacitor C184) into the next memory cell 12, and so forth via an additional RC circuit into the next memory cell until reaching the last memory cell 16.

As a result, the data signal S is attenuated into different input signal amplitudes S1–S6 at the respective input points into the memory cells 11–16; in other words, the first input signal amplitude S1 to the first memory cell 11 is strongest in amplitude, the second input signal amplitude S2 to the next memory cell 12 is reduced in amplitude, and so forth, with the last input signal amplitude S6 to the last memory cell 16 being smallest in amplitude. This causes the enabling signal DL<1> for the first memory cell 11 to be lowest in amplitude and the enabling signal DL<6> for the last memory cell 16 to be largest in amplitude. Since all the inverters 21–26 are set to the same trigger voltage level, the voltages at the respective nodes N1–N6 in the memory cells 11–16 are raised to the trigger voltage level at different times, thus undesirably resulting in signal skew.

SUMMARY OF THE INVENTION

It is therefore an objective of this invention to provide a method for eliminating the above-mentioned signal skew in an SDRAM device.

In accordance with the foregoing and other objectives the invention proposes a method for eliminating signal skew in an SDRAM device. The method is intended for use on a SDRAM device having at least a first memory cell and a second memory cell, which are connected to a common signal line that transmits a data signal to both the first and the second memory cells. Due to the data signal being gradually attenuated along the signal line, the input signal amplitudes at the respective input points into the first and second memory cells are different, which would otherwise cause signal skew. In accordance with the invention the trigger voltage levels of the first and second memory cells are adjusted in such a manner as to be substantially equal to the respective input signal amplitudes at a specific trigger time, so that the first and second memory cells can be triggered substantially concurrently without the occurrence of signal skew. Typically, the trigger voltage levels can be adjusted by adjusting the respective threshold voltages or current gains of the NMOS transistor and PMOS transistor in an inverter used to serve as the I/O buffer of each memory cell.

By the invention, the adjustment is easy to achieve without having to provide additional circuitry to the SDRAM device. The invention is therefore useful in solving the problem of signal skew in the SDRAM device.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

To solve the problem of signal skew due to the data signal being gradually attenuated along the signal line, the invention proposes a method for eliminating signal skew in the SDRAM device by adjusting the respective trigger voltage levels of the memory cells in the SDRAM device in such a manner as to be substantially equal to the respective input signal amplitudes at a specific trigger time. This allows all the memory cells to be triggered substantially concurrently without the occurrence of signal skew. Details of the method of the invention are disclosed in the following.

Figure 3:
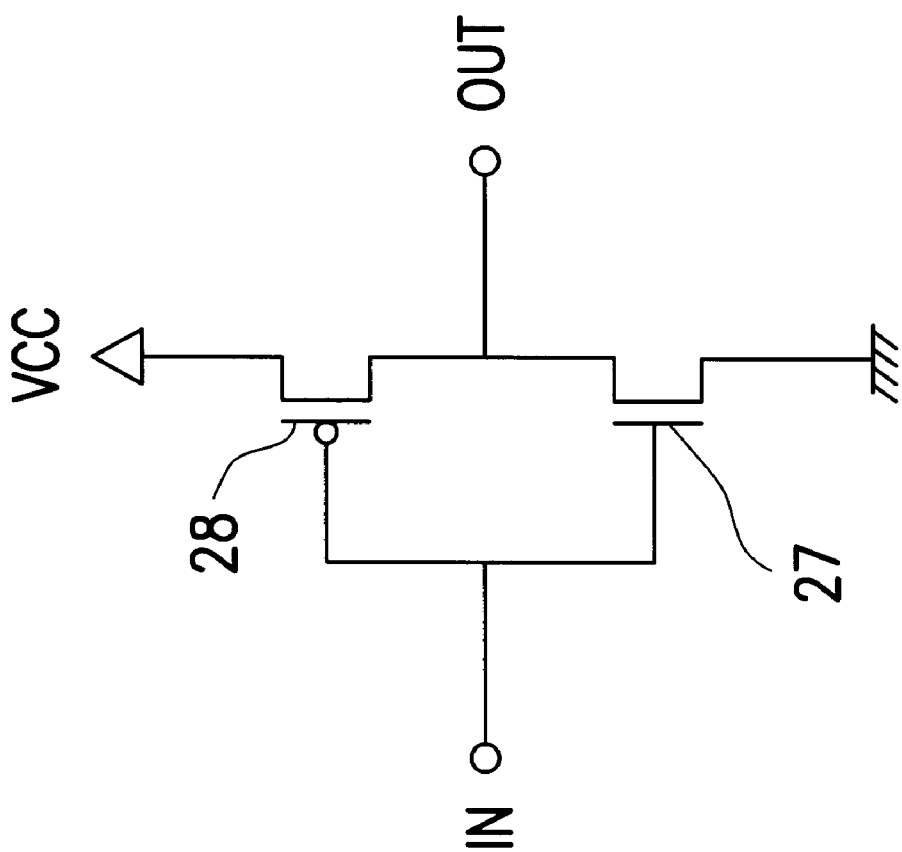
FIG. 3 is a schematic diagram showing the circuit structure of an inverter used in each memory cell in the SDRAM device of FIG. 1.

In respect to the inverter shown in FIG. 3, its trigger voltage $V_{tr}$ can be formulated as follows:

$$V_{tr} = \frac{\sqrt{\frac{\beta_n}{\beta_p}} \cdot V_{tn} + (VDD - V_{tp})}{1 + \sqrt{\frac{\beta_n}{\beta_p}}}$$

where

| | |
|---|---|
| $V_{tr}$ | is the trigger voltage of the inverter; |
| $V_{tn}$ | is the threshold voltage of the NMOS transistor 27 in the inverter; |
| $V_{tp}$ | is the threshold voltage of the PMOS transistor 28 in the inverter; |
| $\beta_n$ | is the current gain of the NMOS transistor 27 in the inverter; and |
| $\beta_p$ | is the current gain of the PMOS transistor 28 in the inverter. |

It can be learned from the foregoing equation that the trigger voltage $V_{tr}$ can be adjusted simply by adjusting the values of $\beta_n$, $\beta_p$, $V_{tn}$, and $V_{tp}$.

Figure 1:
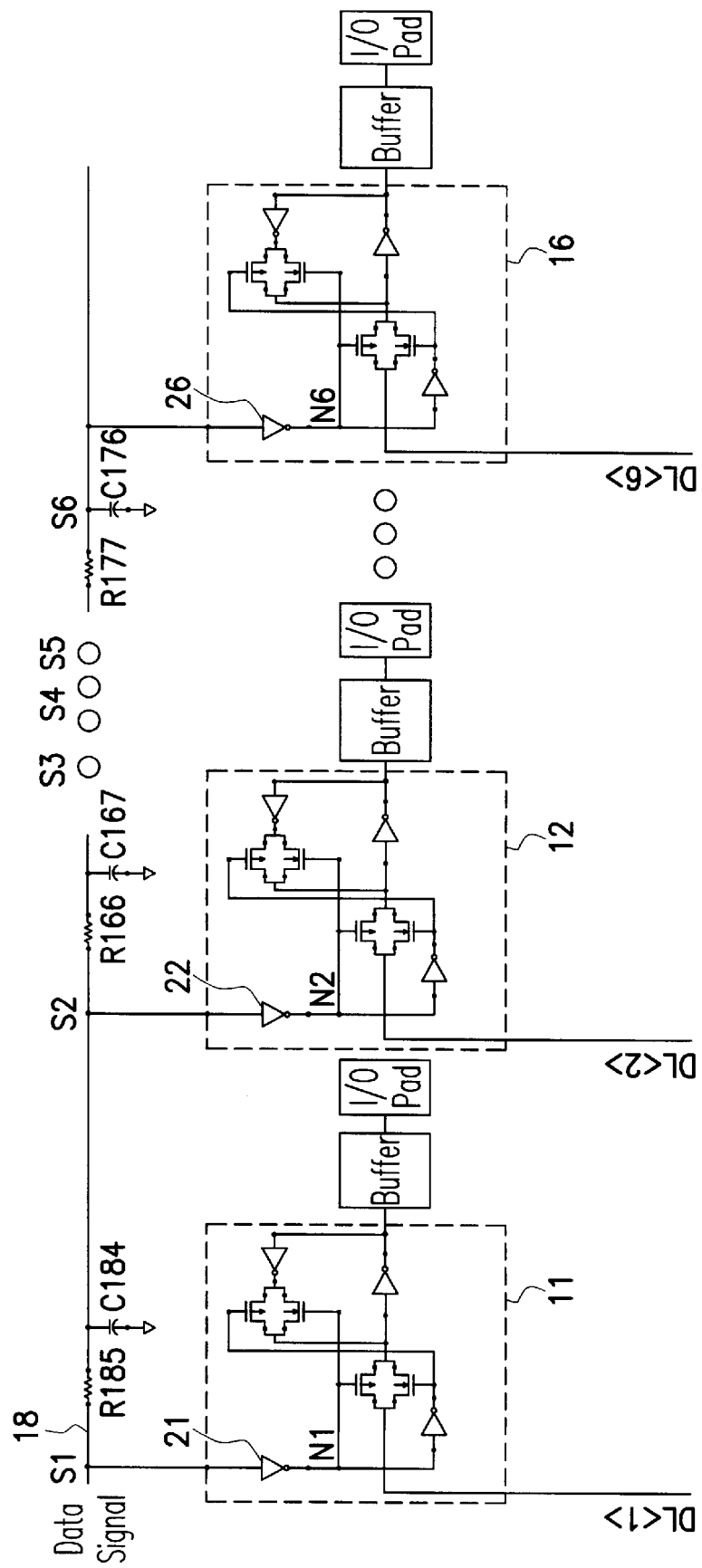
FIG. 1 is a schematic diagram showing the circuit structure of an SDRAM device.

As mentioned in the background section of this specification, signal skew occurs to the SDRAM device of FIG. 1 due to the data signal S being attenuated into different input signal amplitudes S1–S6 at the respective input points into the memory cells 11–16, causing the nodes N1–N6 in the memory cells 11–16 to reach the trigger voltage level at different times. To solve this problem the invention proposes a method that allows all the memory cells 11–16 to be triggered substantially at the same time. Details of this method are disclosed in the following.

Figure 2:
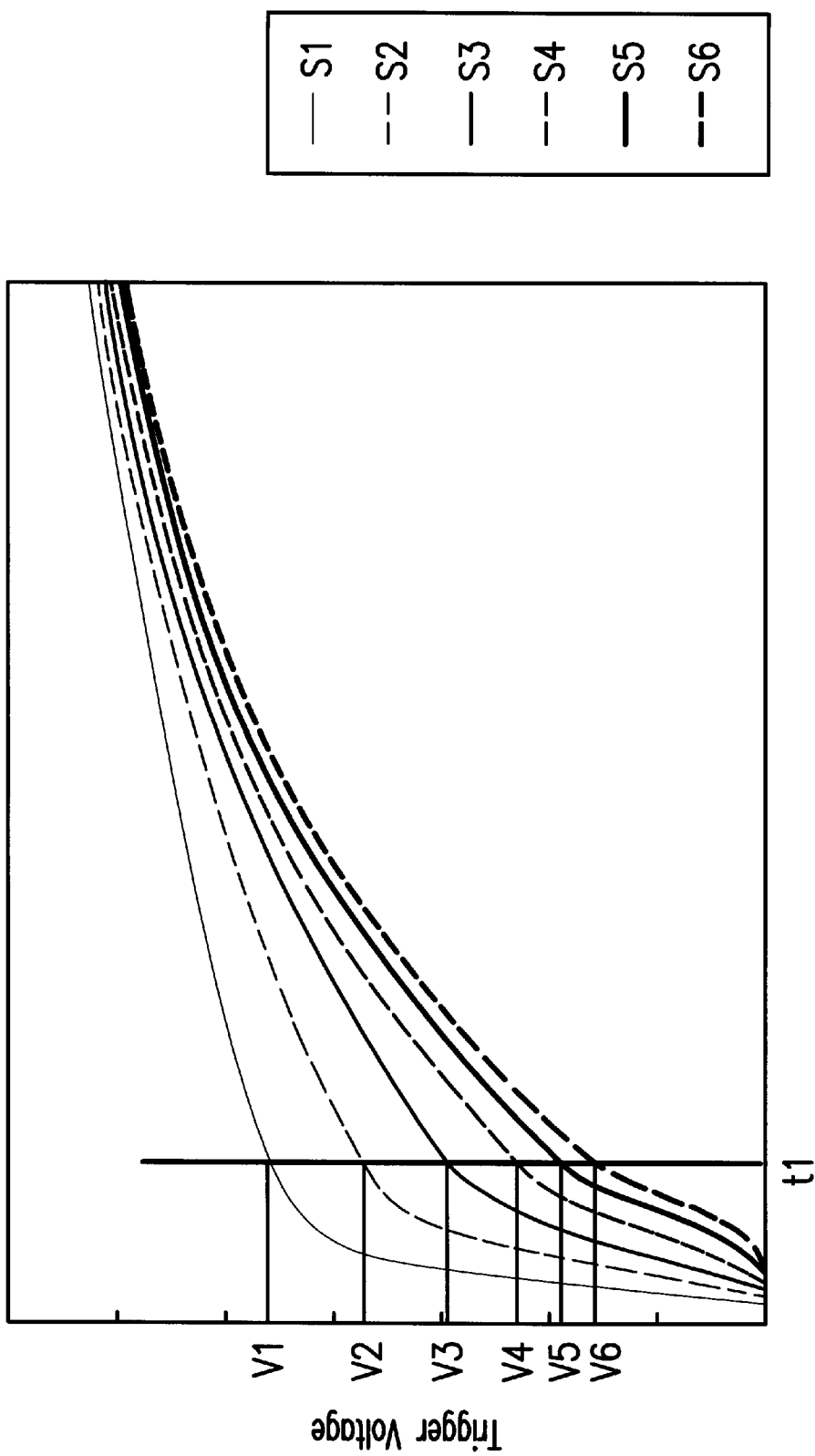
FIG. 2 is a graph, showing the adjustment of the respective trigger voltage levels of the memory cells in an SDRAM device to eliminate signal skew.

In accordance with the invention, the trigger voltage levels of the respective inverters 21–26 in the memory cells 11–16 are adjusted in such a manner as to be substantially equal to the respective input signal amplitudes S1–S6 at the input points into the memory cells 11–16 at the trigger time $t_1$, as illustrated in FIG. 2. As a result, all the inverters 21–26 can reach their respective trigger voltage levels at the trigger time $t_1$, and thus can be triggered precisely at the same time without signal skew.

The foregoing scheme can be achieved simply by adjusting the parameters $\beta_n$, $\beta_p$, $V_{tn,\ and\ Vtp}$ of each of the inverters 21–26 to suitable values that allow the trigger voltage levels to be substantially equal to the respective input signal amplitudes S1–S6 at the input points into the memory cells 11–16 at the trigger time $t_1$. This adjustment is easy to achieve without having to provide additional circuitry to the SDRAM device. The invention is therefore useful in solving the problem of signal skew in the SDRAM device.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for use on a SDRAM device having at least a first memory cell and a second memory cell which are connected to a common signal line which transmits a data signal to both the first and the second memory cells, for the purpose of eliminating signal skew in the SDRAM device due to the data signal being attenuated to different input signal amplitudes at respective input points into the first and second memory cells, the method comprising the step of:

adjusting trigger voltage levels of the first and second memory cells in such a manner as to be substantially equal to the respective input signal amplitudes at a specific trigger time, so that the first and second memory cells can be triggered substantially concurrently in response to the data signal on the signal line without an occurrence of signal skew.

2. The method of claim 1, wherein each memory cell includes an I/O buffer connected to the data signal.

3. The method of claim 1, wherein each I/O buffer includes an inverter having an input end connected to the signal line.

4. The method of claim 3, wherein each inverter includes a NMOS transistor and a PMOS transistor connected to the NMOS transistor.

5. The method of claim 4, wherein adjustment of the trigger voltage levels is achieved by adjusting respective threshold voltages of the NMOS transistor and the PMOS transistor.

6. The method of claim 4, wherein adjustment of the trigger voltage levels is achieved by adjusting respective current gains of the NMOS transistor and the PMOS transistor.

7. A method for use on a SDRAM device having a plurality of memory cells which are connected to a common signal line that transmits a data signal to all of the memory cells, for the purpose of eliminating signal skew in the SDRAM device due to the data signal being attenuated to different input signal amplitudes at the respective input points into the memory cells, the method comprising the step of:

adjusting the trigger voltage levels of the memory cells in such a manner as to be substantially equal to the respective input signal amplitudes at a specific trigger time so that all the memory cells can be triggered substantially concurrently in response to the data signal on the signal line without an occurrence of signal skew.

8. The method of claim 7, wherein each memory cell includes an I/O buffer connected to the data signal.

9. The method of claim 7, wherein each I/O buffer includes an inverter having an input end connected to the signal line.

10. The method of claim 7, wherein each inverter includes a NMOS transistor and a PMOS transistor connected to the NMOS transistor.

11. The method of claim 10, wherein adjustment of the trigger voltage levels is achieved by adjusting respective threshold voltages of the NMOS transistor and the PMOS transistor.

12. The method of claim 10, wherein adjustment of the trigger voltage levels is achieved by adjusting respective current gains of the NMOS transistor and the PMOS transistor.

* * * * *